(12) United States Patent
Ohya et al.

(10) Patent No.: US 6,594,892 B2
(45) Date of Patent: Jul. 22, 2003

(54) PROCESS FOR THE PRODUCTION OF COMPOSITE CERAMIC PRINTED WIRING BOARD

(75) Inventors: Kazuyuki Ohya, Tokyo (JP); Norio Sayama, Tokyo (JP); Takeshi Nobukuni, Tokyo (JP)

(73) Assignee: Mitsubishi Gas Chemical Co., Inc., Tokyo (JP)

( * ) Notice: Subject to any disclaimer, the term of this patent is extended or adjusted under 35 U.S.C. 154(b) by 0 days.

(21) Appl. No.: 09/920,636

(22) Filed: Aug. 3, 2001

(65) Prior Publication Data

US 2002/0040522 A1 Apr. 11, 2002

(30) Foreign Application Priority Data

Aug. 9, 2000 (JP) ........................................ 2000-240992

(51) Int. Cl.$^7$ ................................................ H05K 3/02
(52) U.S. Cl. ............................ 29/846; 29/847; 29/851; 29/852
(58) Field of Search .......................... 29/852, 846, 847, 29/851; 451/41

(56) References Cited

U.S. PATENT DOCUMENTS 34,887 A * 4/1862 Ushifusa et al. .............. 43/102
5,599,413 A * 2/1997 Nakao et al. ................ 156/253
5,707,715 A * 1/1998 deRochemont et al. ...... 428/209
5,998,336 A * 12/1999 Holcomb .................. 174/125.1
6,143,432 A * 11/2000 de Rochemont et al. 427/126.3
6,286,206 B1 * 9/2001 Li .............................. 156/283

* cited by examiner

*Primary Examiner*—Timothy V. Eley
*Assistant Examiner*—Alvin J Grant
(74) *Attorney, Agent, or Firm*—Wenderoth, Lind & Ponack, L.L.P.

(57) ABSTRACT

A process for the production of a composite ceramic printed wiring board, comprising (1) making a penetration hole having a diameter of 0.1 to 0.8 mm in a ceramic board having an open porosity of at least 5% and a thickness of 0.1 to 10 mm, (2) fixing metal (M) to the penetration hole such that the metal (M) penetrates through the penetration hole, (3) impregnating a heat-resistant resin precursor (R) under vacuum, polymerizing the heat-resistant resin precursor (R) and polishing both surfaces of the resultant board to produce a resin composite ceramic substrate (MRA) having a conductive portion for conduction between both surfaces in a predetermined portion, and (4) forming printed wiring networks on one or both surfaces of the resin composite ceramic substrate (MRA).

4 Claims, No Drawings

PROCESS FOR THE PRODUCTION OF COMPOSITE CERAMIC PRINTED WIRING BOARD

FIELD OF THE INVENTION

The present invention relates to a process for the production of a resin composite ceramic printed wiring board having an electrical conductive portion (conductive plug) for conduction between both surfaces in a predetermined portion. The resin composite ceramic printed wiring board obtained according to the present invention may be used under vacuum and under a high temperature of more than 300° C., it substantially has no gas passing between both surfaces thereof and it has excellent dimensional accuracy under a high temperature so that it may be suitably used for materials and auxiliary materials used in steps of producing an electronic part for inspection.

PRIOR ART OF THE INVENTION

Ceramic has various excellent physical properties such as a low thermal expansion coefficient, high thermal dissipation properties and electric insulation properties. These excellent physical properties are utilized for producing printed wiring boards and other products for practical uses.

However, ceramic is generally poor in processability. There are required a special device and a highly developed processing technique for using ceramic as a desired part so that thus-obtained product is expensive. As a result, the use of ceramic is greatly limited.

For the above reasons, when a through hole conductive portion is made, there is taken a method comprising making a hole by drilling or punching at a green sheet stage, filling a conductive paste in the hole with a roller or squeegee and then calcining it.

Further, for overcoming a defect that processing after calcination is very difficult, a machinable ceramic having machinability is developed. However, a machinable ceramic is fragile so that its machinability has a limitation. Further, a machinable ceramic generally has a composite structure for imparting itself with machinability, so that it generally has pores. As a result, the machinable ceramic has a defect in that it shows great changes in physical properties due to moisture absorption.

The production process of a multilayer printed wring board includes a build-up process. This process comprises making a hole in, for example, a copper-clad glass epoxy laminate by drilling, forming a through hole, filling the through hole with a resin, curing the filled resin, polishing the filled resin two-dimensionally, carrying out etching to produce a printed wiring board, using the printed wiring board as a core material and carrying out a build-up multi-layer formation.

The build-up multilayer formation is performed by bonding sheets of a B-stage film material and copper foils for a multilayer formation to both surfaces of a core material under heat, curing the sheets of a B-stage film material, making a hole with a properly selected device, e.g. a laser, filling the hole by pulse plating or the like to form an electrically conductive portion connecting to wiring on a lower layer, forming printed wiring networks on both surfaces by etching and repeating these steps.

Here, a core material is subjected to several heatings in accordance with the number of build-ups so that the core material needs to endure the above heatings sufficiently. For this reason, for example, a general copper-clad glass epoxy laminate has a limitation on the number of build-ups, and a high heat-resistant polyimide film having a low thermal expansion coefficient can not be used as a material for a multilayer formation. Further, it is also difficult to employ a thin film method which can form a fine printed wiring network when a printed wiring network is formed at a build-up time.

Previously, the present inventors completed a process for the production of a substrate having a high thickness accuracy, which is obtained by slicing a novel resin-impregnated cured ceramic that overcomes a defect of water absorption properties, is improved in machinability and is imparted with impact resistance (JP-A-5-291706, etc.). The present inventors made furthermore studies and completed a metal-foil-clad resin composite ceramic board (JP-A-8-244163, etc.) obtained by bonding metal foils to a resin-impregnated cured ceramic layer.

The present inventors have made diligent studies for application of the above production processes and have reached to the present invention.

SUMMARY OF THE INVENTION

It is an object of the present invention to provide a process for the production of a composite ceramic printed wiring board which has excellent properties such as high airproof properties, a low thermal expansion coefficient, high thermal dissipation properties and etc.

According to the present invention, there is provided a process for the production of a composite ceramic printed wiring board, comprising (1) making a penetration hole having a diameter of 0.1 to 0.8 mm in a ceramic board having an open porosity of at least 5% and a thickness of 0.1 to 10 mm, (2) fixing metal (M) to the penetration hole such that the metal (M) penetrates through the penetration hole, (3) impregnating a heat-resistant resin precursor (R) under vacuum, polymerizing the heat-resistant resin precursor (R) and polishing both surfaces of the resultant board to produce a resin composite ceramic substrate (MRA) having a conductive portion for conduction between both surfaces in a predetermined portion, and (4) forming printed wiring networks on one or both surfaces of the resin composite ceramic substrate (MRA).

DETAILED DESCRIPTION OF THE INVENTION

In the process for the production of a composite ceramic printed wiring board, provided by present invention, open pores of the ceramic board (A) are impregnated with an organic substance which is solid or may be converted to a solid at room temperatures, and the formation of the hole in the above 1) is performed in the organic substance-impregnated ceramic board. After the formation of a hole, the above organic substance is removed before the impregnation of the thermosetting resin (R) in the above 3). The metal (M) is selected from gold, silver, copper, tin, nickel, and alloys of these metals, a conductive paste containing a powdery material of the metal (M) and an inorganic binder as essential components is used to fill the hole, the binder is dried and cured at a low temperature of 90 to 250° C. and an organic compound is decomposed and removed at a maximum temperature of 1,100° C. or less as required. Otherwise, the metal (M) is a wire or a cross-section multiform wire made of a metal or alloy selected from gold, silver, copper, tin, nickel, and alloys of these metals, or a wire of a low thermal-expansion-coefficient metal, such as Kovar (Fernico) or tungsten, of which the surface is plated with gold, copper, nickel or the like, the wire is inserted through the hole and the inserted wire is fixed through the hole.

The constitution of the present invention will be explained hereinafter.

The ceramic board (A) of the present invention is selected from ceramic boards having an opening porosity of at least 5% by volume, preferably 5 to 35% by volume, an average pore diameter of 0.1 to 10 µm and a thickness of 0.1 to 10 mm.

Specifically, it includes composite materials having a boron nitride (h-BN) content of 8 to 40% by weight, such as aluminum nitride-boron nitride (AlN-h-BN), aluminum oxide-boron nitride ($Al_2O_3$-h-BN), silicon nitride-boron nitride ($Si_3N_4$-h-BN), zirconium oxide-aluminum nitride-boron nitride ($ZrO_2$-AlN-h-BN) and aluminum oxide-zirconium oxide-boron nitride ($Al_2O_3$-$ZrO_2$-h-BN) and an inorganic continuously porous body (A) such as β-silicone carbide porous body (β-SiC), silicone oxide-aluminum oxide-zirconium oxide ($SiO_2$-$Al_2O_3$-$ZrO_2$), β-wollastonite (β-$CaSiO_3$), spodumene ($LiAlSi_2O_6$), magnesium titanate ($MgTiO_3$), barium titanate ($BaTiO_3$) and mica.

Of these, preferred are those which contains aluminum nitride (AlN) or zirconium oxide ($ZrO_2$) as a main component.

In the present invention, the metal (M) to be fixed in the penetration hole is formed by a method using a conductive paste. Otherwise, there is employed method in which a wire of metal or its alloy or a cross-section multiform wire is inserted in a hole and it is fixed therein.

The method using a conductive paste comprises selecting, as the metal (M), a metal or alloy from gold, silver, copper, tin, nickel, and alloys of these metals, filling a hole with a conductive paste containing a powdery material of the metal (M) and an inorganic binder as essential components, drying and curing the binder at a low temperature of 90 to 250° C. and optionally decomposing an organic compound at a maximum temperature of 1,100° C. or lower.

The inorganic binder component in the conductive paste includes a water-soluble inorganic polymer, a colloidal oxide and silicone ester. As the water-soluble inorganic polymer, an aqueous solution of an alkaline metal silicate or metal phosphate may be used. As the colloidal oxide, there may be used an aqueous dispersion of colloidal particles of silicic acid or remain. As the silicone ester, there may be used ethyl silicate and ladder silicone. Concerning the composition thereof, 5 to 15% by weight of the metal is kneaded with a solution or dispersion of the inorganic binder.

In the second method using a metal wire or a multiform wire (wires having a polygon cross section, including a star-shape cross section, tube), a wire or a multiform wire, as the metal (M), selected from gold, silver, copper, tin, nickel and alloys of these metals is inserted in the hole and fixed to the hole. As the above metal (M), there may be used a wire of a low thermal-expansion-coefficient metal, such as Kovar (Fernico) or tungsten, of which the surface is plated with gold, copper or the like. When a wire having a general cross-sectional shape is used as the wire, it is preferred to use a twist wire composed of at least two pieces of wires, in particular approximately three pieces of wires, in view of fixing stability after the filling of the hole and moderation of a thermal stress when used as a printed wiring board.

The heat-resistant resin precursor (R) used in the present invention refers to a product which is polymerized by a curing reaction or a cross-linking reaction without generating any byproducts substantially at the stage of molding and making a composite (the stage of polymerization). It includes a thermosetting resin, a thermoplastic polyimide resin precursor and a ladder silicone resin.

The thermosetting resin includes epoxy resins from bisphenol A, phenol novolak, aromatic hydrocarbon-formaldehyde resin modified novolak and the like, cyanate resins such as a cyanate resin, a cyanate-epoxy resin, a cyanate-maleimide resin, a cyanate-maleimide-epoxy resin, a bisallylnadmide resin, a maleimide resin, a maleimide-vinyl resin, polysilazane and polyimidesiloxane.

The thermoplastic polyimide resin precursor refers to a product which is an organic solvent solution of an amide carboxylic acid-state prepolymer antecedent to the complete formation of an imide ring. Specifically, it includes a condensation product of bihenyl tetracarboxylic acid dianhydride and aromatic diamine (Yuplfine LT 200: supplied by Ube Industries, Ltd), and a condensation product of 3,3',4, 4'-biphenylsulfone tetracarboxylic acid dianhydride and aromatic diamine (Rikacoat SN 20, PN 20: supplied by New Japan Chemical Co., Ltd, U imide A, B: supplied by UNITIKA LTD).

Typical example of the ladder silicone resin includes, as commercially available product, Glass Resin GR-908, Glass Resin GR-650 and Glass Resin GR-200, trade name, supplied by Owens-Illinois. Generally, it is used as a solution of an organic solvent. A heating at a high temperature of more than 300° C. is required for completely curing the ladder silicone resin. Therefore, impregnation with the organic solvent solution and the removal of the organic solvent by drying are repeated several times for performing more complete impregnation and then a press molding is carried out under a reduced pressure, whereby a impregnation-cured product capable of being mirror-polished can be obtained. Further, there is no need to worry about a pre-reaction of the organic solvent solution used for impregnation, and there is an advantage that the organic solvent solution may be repeatedly used for impregnation. The heat resistant resin precursor (R) such as a ladder silicone resin solution may be used alone. The heat resistant resin precursors (R) different in kind may be used in combination for imparting desired properties.

Next, the present invention will be explained with reference to production steps.

In step (1), processing for making a hole having a diameter of 0.1 to 0.8 mm for a through hole is performed in a ceramic board (A). The ceramic board (A) in which a hole is to be made is preferably selected from ceramic boards continuous (open) pores of which are impregnated with an organic substance that is a solid or is converted to a solid at ordinary temperatures. The impregnation of an organic substance into pores prevents a foreign substance from entering into open pores during making a hole, and the impregnation improves the ceramic board (A) in impact strength so that it has the effect of preventing breakage such as cracks from occurring. Further, when a conductive paste is used for the through fixation in step (2), the above impregnation has the effect of preventing metal or metal ion from impregnating into continuous (open) pores around the penetration hole during heating.

Examples of the organic substance include a substance usable in a step of forming a thin board by slicing the above ceramic, such as synthetic or natural waxes and resins solid at room temperatures (JP-A-8-13246), a resin substance usable for producing resin composite ceramic boards (JP-A-5-291706, JP-A-8-244163, etc.), or a solution of a high-molecular weight substance such as a solution of a thermoplastic resin. The above substances can be used in the form of a solution.

The impregnated organic substance is removed after the formation of a hole and before impregnation of a heat-resistant resin precursor (R) in step 3.

Next, in step (2), metal is fixed through the hole. The method therefor is properly selected from the two methods, as described before. Concurrently with the above step 2 or before or after the step 2, the above organic substance used in the processing of a hole is removed and a surface-treatment is carried out for improving the affinity of the ceramic board (A) with the heat-resistant resin precursor (R) (or its high molecular weight polymer). Then, the heat-resistant resin precursor (R) is impregnated under vacuum in step 3.

In the method using a conductive paste, the hole is filled with a conductive paste, and the conductive paste is cured at a low temperature (generally 80 to 250° C.) and then fixed at maximum temperature of 1,100° C. or lower. After the fixation, generally, the conductive paste is also used for making a protuberance on each of the upper and lower external portions of the conductive paste-filled hole. Further, the temperature for the maximum-temperature heat-treatment is properly selected depending upon metal components used for the conductive paste, and it is preferred to select a temperature where particles of metal powder are fused to each other due to proper workings of subsidiary components. Further, in this step of fixation at maximum temperature of 1,100° C. or lower, the organic substance used in the processing of a hole is completely removed, and then, the surface-treatment is carried out.

In the method using metal wire or multiform wire (wires having a polygon cross section including a star-shape cross section, other than a circular cross-section, and wires prepared by bending a plate, tube etc.), generally, after the formation of a hole, the organic substance is removed, the surface treatment for improving the affinity of the ceramic board (A) with the heat-resistant resin precursor (R) is carried out, and the resultant board is used. A wire or multiform wire is fixed by a method in which the wire or multiform wire is inserted in the hole such that the wire or multiform wire penetrates through the hole and each end portion of the wire or multiform wire is bent at each of the upper and lower sides of the hole or a method in which the wire or multiform wire is cut to have a length longer than the depth of the hole, the cut wire or multiform wire is inserted through the hole, and the wire is pressed from both sides. Wires having a long length or wires having a desired length prepared by cutting are used.

The surface treatment for improving the affinity of the ceramic board (A) with the heat-resistant resin precursor (R) is carried out as follows. Open pores of the ceramic board (A) are impregnated with a properly prepared solution of a compound comprising aluminum, titanium or silicon or an organic metal compound (M) which is a prepolymer having a weight average molecular weight less than 10,000, the impregnated compound or organic metal compound (M) is fixed by a heat-treatment, and further, it is thermally decomposed at a temperature of 850° C. or lower, whereby a metal compound which is carbonate, oxide or a composite oxide is formed on each surface of the open pores (See U.S. Pat. No. 5,686,172).

Then, in step 3, the heat-resistant resin precursor (R) is impregnated in the ceramic board (A) under vacuum and polymerized, and both surfaces of the resultant board are polished, whereby a resin composite ceramic substrate (MRA) having a conductive portion for conduction between both surfaces in a predetermined portion is produced.

The impregnation of the heat-resistant resin precursor (R) under vacuum is carried out as a solventless liquid or a solvent solution.

When the heat-resistant resin precursor (R) is a product which is a relatively low viscosity liquid at ordinary temperatures or is converted to a relatively low viscosity liquid by heating and when the proceeding of gelation or the like is slow in the state of the above relatively low viscosity liquid, the heat-resistant resin precursor (R) is preferably used as a solventless liquid. For example, when the heat-resistant resin precursor (R) is 2,2-bis(4-cyanatophenyl) propane which is a thermosetting resin monomer, it is heated at approximately 120° C. to obtain a molten liquid, the ceramic board (A) is impregnation-treated with the molten liquid under a reduced pressure, preferably a reduced pressure of 1 kPa or less, for at least 15 minutes, preferably 20 to 60 minutes, the resultant board is taken out and cooled and the cooled board is press-molded under heat at approximately 190° C. under a reduced pressure atmosphere (generally 10 kPa or less) for 1 to 2 hours.

When the heat-resistant resin precursor (R) is a product which is solid or is not converted to a low viscosity liquid at ordinary temperatures or at 150° C. or less, procedures of impregnating as a solvent solution and removing the solvent are repeated to impregnate it as minutely as possible. For example, when a ladder silicon GR-908 is used, a solution of the ladder silicon in an organic solvent (xylene) is prepared, the ceramic board (A) is impregnated with the above solution under vacuum, taken out, air-dried and dried under heat at approximately 250° C. for 1 hour, the above procedures are repeated several times (generally four times in total) to obtain a substantially completely impregnated state, and the resultant board is press-molded under heat at approximately 350° C. under a reduced pressure for 1 to 2 hours. Further, in this method using a solvent solution, there may be used a thermoplastic polyimide resin or its precursor in the range where an increase in viscosity is allowed.

The polishing of both surfaces is carried out as follows. Each of the upper and lower external portions of the metal-fixed hole generally has a protuberance so that these portions are roughly ground with, for example, a grinding tool of approximately #200 or higher to obtain approximately flat and smooth surfaces. Then, both the surfaces are polished with a two-dimensionally grinding machine or a double-side lapping machine so as to have a predetermined thickness, a predetermined flatness degree and a predetermined smoothness degree.

When circuits are formed by a thin film method, a conductive thin film preferably has a thin thickness of 0.2 to 2 $\mu$m and a surface roughness of Ra<0.3 $\mu$m. It is preferred to carry out a surface polishing by chemical mechanical polishing (CMP). For example, when an aluminum nitride sintered body is used as an inorganic continuous porous sintered body, CMP using an alkaline colloidal silica is preferred.

In step 4, a printed wiring network is formed on one surface or both surfaces of the above-produced resin composite ceramic substrate (MRA) having a conductive portion for conduction between both surfaces, to obtain a composite ceramic printed wiring board of the present invention.

The printed wiring network is formed by a method based on a metallization method using a known electroless plating or a method based on various physical or chemical vacuum deposition methods as required.

When a method based on an electroless copper plating is adopted, a printed wiring network is formed with copper by an electroless plating→a resist pattern formation→an electroplating→a resist detachment→a flush etching, and then nickel plating (2 to 8 μm) or gold plating (0.1 to 6 μm) is carried out for protection as required.

When a vacuum deposition method is adopted, for example, a typical thin film method which gives a 0.2 to 2 μm-thick conductor produces a printed wiring network by a resist formation→argon spattering→deposition. The deposition consists of three layers composed of a primary coat layer, an internal layer and a top layer or two layers composed of a primary coat layer and an internal layer. Examples of a material for the primary coat layer include Ti, Zr, Cr, Mo, NI-Cr and etc., examples of a material for the internal layer include of Ni, Pd, Pt, Cu and etc., and examples of a material for the top layer include Au, Ag and etc. Specific examples include Ti/Pt/Au, Ti/Pd/Au, Ti/Mo/Au, Cr/Au, Ni—Cr/Cu/Au, Ni—Cr/Cu and W/Ni/Au.

In the deposition method, inappropriate is the presence of metal such as silver, lead or tin in a deposition treatment system. On this account, when a deposition method is employed, the metal used for the conductive portion between both surfaces in the resin composite ceramic substrate (MRA) is selected from metals other than metals inappropriate for use in a vacuum system such as silver, lead, tin and etc.

The present composite ceramic printed wiring board explained above is suitable for use in a high vacuum system as a printed wiring board in which a conductive portion between both surfaces is completely blocked. Further, the present composite ceramic printed wiring board has remarkably high heat-resistant so that it may be suitably used as a printed board material for a multilayer formation of a heat-resistant multilayer board. Particularly, the present composite ceramic printed wiring board is suited for use as a core material of a heat-resistant build-up multilayer board.

The production processes of a build-up multilayer board can be divided by various dividing methods. However, its constituent techniques are divided to 1) the kind of a build-up insulating layer and its production process, 2) the kind of a method of a through-hole conduction, a hole-making method and a metalization method and 3) production process of a conductor and a pattern of a build-up printed wiring network.

Generally, the above constituent technique 1) is divided into 1. a method using a photosensitive thermosetting resin, 2. a method using a thermosetting resin and 3. a method using a resin-attached corner foil. In the present invention, while each of the above methods may be used, the present invention has a characteristic feature in that there may be used a thermosetting or thermoplastic polyimide resin which requires a high temperature for forming an insulating layer.

Next, the above constituent technique 2) is divided into 1. a method using a penetration hole and 2. a method using a connection hole connected to a conductor positioned right below, and is also divided by a hole-making method into 1. a laser and 2. a drill. The above constituent technique 2) is generally selected in view of a combination thereof with a circuit design or a selection of a material as required, and a selection is similarly carried out in the present invention.

Further, the above constituent technique 3) is divided into 1. a method of forming a single-side or double-side cooper-foil-clad layer and 2. a method of forming a through hole and a printed wiring network by electroless plating or a deposit method. When a fine printed wiring network is also required on a build-up layer, in the present invention, both surfaces of the present composite ceramic printed wiring board to be used as a core substrate are preferably flatter and smoother and it is preferred to employ a deposition method.

EXAMPLES

The present invention will be explained concretely with reference to Examples hereinafter. In Examples, "%" stands for "% by weight" unless otherwise specified.

Example 1

As a continuous porous ceramic, there was prepared an aluminum nitride-boron nitride porous sintered body having a thickness of 25 mm and a diameter of 230 mm (h-BN content 13%, bulk density 2.70 g/cm$^3$, true porosity 13.0% by volume, average pore radius 0.48 μm, to be referred to as "AN1" hereinafter).

AN1 was placed in a container and the container with AN1 in it was placed in a vacuum impregnation vessel of a vacuum impregnator. Then, a solution of a rosin wax in isopropanol (IPA) (solid content concentration 20% by weight, to be referred to as "L1" hereinafter) was added to the container.

The pressure in the vacuum impregnation vessel was decreased to a pressure reduction degree close to a boiling point of IPA in L1 at room temperature (25° C.), and ultrasonic wave was intermittently applied for 3 hours to impregnate AN1 with L1.

After the impregnation, the L1-impregnated AN1 was taken out. The L1-impregnated AN1 was naturally dried in a room at room temperature for approximately 5 hours and then dried with a dryer at 80° C. to obtain a L1-impregnated AN1 (to be referred to as "AN1-L" hereinafter).

AN1-L was sliced with a multi-blade saw, to obtain a ceramic substrate having a thickness of 1.85 mm (to be referred to as "AN1-LS" hereinafter). 800 through holes were made in the substrate AT1-LS in predetermined positions with an ultrahard miniature drill having a diameter of 0.35 mm (order number; 0.35MX, supplied by Mitsubishi Materials Corporation) and 3 through holes as a guide hole were similarly made with a drill having a diameter of 3.0 mm (order number; MS300, supplied by Mitsubishi Materials Corporation), to obtain a hole-processed AN1-LS (to be referred to as "AN1-LS-d" hereinafter).

A conductive paste (supplied by AREMCO PRODUCTS INC., U.S.A, trade name: Pyroduct 597, silver particle base) was injected into the 0.35 mm-diameter through holes of AN1-LS-d with a dispenser. The conductive paste was naturally dried at room temperature for 2 hours and then cured at 93° C. for 2 hours, to obtain a silver-through-processed ceramic substrate (to be referred to as "AN1-LSAg" hereinafter). The substrate AN1-LSAg was placed in a dryer and dried by increasing the temperature stepwise in the manner of 120° C./60 minutes→180° C./30 minutes→250° C./30 minutes.

The substrate AN1-LSAg was taken out and placed on an alumina plate. Then, the substrate AN1-LSAg was placed in a muffle furnace, and temperature-increased from 250° C. to 700° C. at a rate of 8° C./minute. The substrate AN1-LSAg was maintained at 700° C. for 30 minutes, and then cooled to give a silver-through-fixed substrate (to be referred to as "AN1-Ag" hereinafter).

A solution containing 5% of aluminum tris (ethylacetylacetonate) (trade name: ALCH-TR, supplied by Kawaken Fine Chemical K.K.), 30% of mixed xylene and 65% of IPA (to be referred to as "solution A1" hereinafter) was prepared.

AN1-Ag was placed in a container and this container was placed in a vacuum impregnation vessel. The solution A1 was poured into the container. The pressure in the vacuum impregnation vessel was decreased to a pressure reduction degree close to a boiling point of the solution A1, and an impregnation treatment was carried out at room temperature for 30 minutes.

After the impregnation, A1-impregnated AN1-Ag was taken out and naturally dried at room temperature for approximately 5 hours. The A1-impregnated AN1-Ag was placed in a dryer and dried by increasing the temperature stepwise in the manner of 120° C./60 minutes+180° C./30 minutes+250° C./30 minutes.

The A1-impregnated AT1-Ag was taken out and placed on alumina plate. Then, the A1-impregnated AN1-Ag was placed in a muffle furnace, and temperature-increased from 250° C. to 750° C. at a rate of 8° C./minute. A1-impregnated AN1-Ag was maintained at 750° C. for 30 minutes, and then cooled to give AN1-Ag surface-treated with aluminum (to be referred to as "AN1-AgA" hereinafter)

A solution of a thermosetting resin composition (to be referred to as "resin R1" hereinafter) was prepared by mixing 60% of ladder type silicone oligomer (Supplied by Owens-Illinois, trade name; glass resin GR-908, methyl group:phenyl group at side chain=1:4) and 40% of a mixed xylene solvent.

The above-obtained AN1-AgA was placed in a container and the container was placed in an impregnation vessel of a pressure-reducible ultrasonic impregnator. On the other hand, the above-prepared resin R1 was placed in a resin solution vessel of the pressure-reducible ultrasonic impregnator. The pressure in the resin solution vessel was reduced to 1 mmHg (0.665 kPa) and maintained at room temperature for 5 minutes. The pressure in the impregnation vessel was set at the same pressure reduction degree, and the resin R1 was gradually introduced into the container through the bottom of the container. Then, ultrasonic wave was intermittently applied for 3 hours with maintaining the pressure reduction degree, to carry out impregnation under vacuum.

Then, AN1-AgA impregnated with the resin R1 was taken out of the impregnator. While the resin on the surface of AN1-AgA was removed by dropping it, the AN1-AgA impregnated with the resin R1 was naturally dried at room temperature for 16 hours. Then, it was stepwise dried with a hot-air dryer in the manner of 120° C./60 minutes→180° C./30 minutes→250° C./30 minutes and then cooled to room temperature.

This AN1-AgA impregnated with the resin R1 was used and the procedures of vacuum impregnation by ultrasonic wave and stepwise-drying were carried out twice (three times in total) in the same manner as above except that the time period of the vacuum impregnation by ultrasonic wave in the above vacuum impregnation step was changed to 12 hours, whereby a resin R1-impregnated AN1-AgA (to be referred to as "AN1-AgAR" hereinafter) was obtained.

A 0.4 mm thick heat-resistant aluminum alloy sheet having a Teflon-processed surface was placed on each of the surfaces of the above AN1-AgAR. The resultant set was set between hot pressing plates, and the hot pressing plates were moved to bring the set into a state where the set was in contact with the hot press plates with no pressure. In this state, the pressure reduction was initiated and then the heating of the hot press plates was initiated.

When the temperature of AN1-AgAR reached 150° C., the application of a pressing pressure was initiated, and the pressure was set at 0.3 MPa (3 kgf/cm$^2$). The AN1-AgAR was heated and temperature-increased up to 350° C. at a rate of 6° C./minute and the temperature was maintained at 350° C. for 1 hour. Then, the heaving was terminated and the AN1-AgAR was naturally cooled at room temperature to obtain a resin-cured AN1-AgAR.

Both surfaces of the above-obtained resin-cured AN1-AgAR were roughly ground with a wet sander having a sandcloth of SiC #240, then, polished to a thickness of 1.65 mm with a lapping machine (supplied by Okamoto Machine Tool Works, Ltd, GRIND-X SPL-15T, number of revolutions 20 rpm, load 7 kg) using a green carbon grain size #320 (supplied by Fujimi incorporated, trade name; GC#320), and further polished to a thickness of 1.60 mm with a lapping machine (supplied by Okamoto Machine Tool Works, Ltd, GRIND-X, SPL15T, number of revolutions 20 rpm, load 7 kg) using a green carbon grain size #1200 (supplied by Fujmi incorporated, trade name; GC#1200), whereby a resin composite ceramic substrate (to be referred to as "CR1-AN1-Ag" hereinafter) was obtained.

The resin composite ceramic substrate CR1-AN1-Ag was measured for a helium transmission rate and conductor resistance and drawing strength (shear resistance) of a silver-through portion. Table 1 shows the results.

Thereafter, the resin composite ceramic substrate CR1-AN1-Ag was washed with weak alkali and then with water, etched with a sodium hydroxide aqueous solution (3 to 5%) containing 0.5% of a surfactant for 5 minutes, and then plated by direct plating according to a palladium colloid method to form a plating layer having a thickness of 10 $\mu$m.

Both surfaces of the resultant substrate was polished with a #400 buff (polished amount approximately 2 $\mu$m) and further etched by soft etching (etched amount 0.3 $\mu$m).

Both the surfaces thereof were coated with a photo resist, followed by exposure, development and etching to form predetermined printed wirings. Further, nickel plating and gold plating were carried out to obtain a composite ceramic printed wiring board (to be referred to as "PW-CR1-AN1-Ag" hereinafter).

The composite ceramic printed wiring board PW-CR1-AN1-Ag was measured for physical properties. Table 2 shows the results.

Example 2

The same hole-processed substrate AN1-LS-d as that in Example 1 was provided. A copper particle-based paste supplied by Shoei Kagaku Kogyo, trade name: C-4111K, copper particle base) as a conductive paste was injected with a dispenser.

Then, the paste was naturally dried at room temperature for 2 hours and dried at 120° C. for 30 minutes to obtain a copper-through-processed ceramic substrate (to be referred to as "AN1-LSCu" hereinafter). The substrate AP1-LSCu was placed in a dryer and dried by increasing the temperature stepwise in the manner of 150° C./30 minutes→180° C./30 minutes→200° C./30 minutes.

The substrate AN1-LSCu was taken out and placed on an alumina plate. The substrate AN1-LSCu was placed in a muffle furnace having a nitrogen atmosphere therein and temperature-increased from 200° C. to 900° C. at a rate of 8° C./minute. The substrate AN1-LSCu was maintained at 900° C. for 10 minutes, and then cooled to obtain a copper-through substrate (to be referred to as "AN1-Cu" hereinafter)

Thereafter, the above AN1-Cu was used, and an aluminum chelate treatment, impregnation with a ladder type silicone resin (GR-650) and drying (repeated three times), molding and curing, and surface-polishing were carried out in the same manner as in Example 1, to obtain a copper-through-processed resin composite ceramic substrate (to be referred to as "CR1-AN1-Cu" hereinafter). In the above surface-polishing, the final surface-polishing was carried out with a green carbon grain size #2000 (supplied by Fujimi incorporated, trade name; GC#2000) in place of the green carbon grain size #1200.

The resin composite ceramic substrate CR1-AN1-Cu was measured for a helium transmission rate and conductor resistance and drawing strength (shear resistance) of a copper-through portion. Table 1 shows the results.

The resin composite ceramic substrate CR1-AN1-Cu was heat-treated in a nitrogen atmosphere furnace (oxygen concentration 5 ppm) at 400° for 2 hours. Outgassing was carried out to the utmost, and a photosensitive polyimide film was formed with a spin coater (supplied by Oshikane, model name; SC-400R) and dried (film thickness 4 $\mu$m).

Further, the photosensitive polyimide film was exposed to an ultraviolet amp through a predetermined pattern film, followed by development and drying. The resist pattern-attached CR1-AN1-Cu was placed in a vacuum furnace, the vacuum degree was set at $4\times10^{-4}$ torr ($5.3\times10^{-2}$ Pa), then argon was introduced and spattering was carried out at the same vacuum degree for approximately 15 minutes.

Then, the argon was discharged. Ni—Cr was deposited at a vacuum degree of $5\times10^{-4}$ torr ($6.6\times10^{-2}$ Pa) to form a Ni—Cr layer having a thickness of 0.1 $\mu$m and further, copper was deposited to form a copper layer having a thickness of 4 $\mu$m. Then, a heat-treatment was carried out in a nitrogen gas atmosphere furnace (oxygen concentration: 0.2 ppm) at 380° C. and the resist was removed, whereby a desired copper-plug thin film printed wiring was obtained.

The obtained copper-through thin film resin composite ceramic printed wiring board (to be referred to as "PW-CR1-AN1-Cu" hereinafter) was tested for a temperature cycle. Table 2 shows she results.

Example 3

As a raw material board for a continuous porous ceramic board, a zirconia-spodumene continuous porous sintered body having a thickness of 8.0 mm and a diameter of 320 mm (composition: zirconia 10%, silica 60% alumina 20%, lithium and etc. 10%, bulk density 2.10 g/cm$^3$, true porosity 18.0 vol %, average pore radius 2.31 $\mu$m) in place of the aluminum nitride-boron nitride porous sintered body used in Example 1 was provided. The zirconia-spodumene continuous porous sintered body was treated in the same manner as in Example 1. The zirconia-spodumene continuous porous sintered body was said with a multi-blade saw to obtain a ceramic substrate having a thickness of 1.85 mm (to be referred to as "SZ1" hereinafter).

800 through holes were made in the substrate SZ1 in predetermined positions with an ultrahard miniature drill having a diameter of 0.40 mm (supplied by Mitsubishi Materials Corporation, order number; 0.40MX and 3 through holes as a guide hole were similarly made with a drill having a diameter of 3.0 mm (supplied by Mitsubishi Materials Corporation, order number; MS300), to obtain a hole-processed SZ1 (to be referred to as "SZ1-d" hereinafter).

The substrate SZ1-d was placed in a dryer and dried by increasing the temperature stepwise in the manner of 50° C./30 minutes→180° C./30 minutes→200° C./30 minutes. The substrate SZ1-d was taken out and placed on an alumina plate. The substrate SZ1-d on the alumina plate was placed in a nitrogen atmosphere furnace and temperature-increased from 200° C. to 700° C. at a rate of 8° C./minute. The substrate SZ1-d was maintained at 700° C. for 10 minutes and then cooled, whereby the rosin was completely removed and a cleaned hole-processed substrate (to be referred to as "SZ1-C" hereinafter) was obtained. The substrate SZ1-C was surface-treated for improving the affinity of the substrate with a resin in the same manner as in Example 1, to obtain a substrate (to be referred to as "SZ1-A" hereinafter).

A copper-plated Kovar wire (wire obtained by forming 20 $\mu$m thick copper plating on Kovar wire 0.3 mm, supplied by Sumitomo Metal Industries, Ltd, trade name; KV-2) was inserted in each of the 0.4 mm-diameter through holes of the substrate SZ1-A such that the copper-plated Kovar wire penetrated through the through hole, both ends of the wire were bent on both surfaces of the substrate SZ1-A, and then both the ends of the wire were cut so as to leave both the ends of the wire slightly.

The resultant substrate SZ1-A was dried at 120° C. for 15 minutes, and the dried substrate was impregnated with, as on impregnation resin, a solventless epoxy resin composition (to be referred to as "Resin R3" hereinafter) containing 53.1% of a bisphenol A type epoxy resin (trade name: Epikote 828, supplied by Yuka-Shell Epoxy K.K.), 45.1% of methylhexahydro phthalic anhydride, 1.6% of γ-glycidoxypropyltrimethoxysilane and 0.2% of triethanolamine. The resin-impregnated substrate was molded and cured. Both surfaces of the resultant substrate were polished in the same manner as in Example 2 to obtain a copper-plated-Kovar wire-through resin composite ceramic substrate (to be referred to as "CR1-SZ1-Kv" hereinafter).

The above substrate CR1-SZ1-Kv was measured for a helium transmission rate, conductor resistance and shear resistance. Table 1 shows the results. Further, a printed wiring pattern was formed on the substrate CR1-SZ1-Kv in the same manner as in Example 1. The obtained printed wiring board was tested for a heat cycle. Table 2 shows the results.

Example 4

A through hole-formed substrate (AN1-LS-d) was obtained in the same manner as in Example 1. The substrate AN1-LS-d was placed in a dryer and dried by increasing the temperature stepwise in the manner of 150° C./30 minutes→180° C./30 minutes→200° C./30 minutes. The substrate AN1-LS-d was taken out and placed on an alumina plate. The substrate AN1-LS-d on the alumina plate was placed in a nitrogen atmosphere furnace, temperature-increased from 200° C. to 700° C. at a rate of 8° C./minute, maintained at 700° C. for 10 minutes, and then cooled to remove the organic substance. The substrate AN1-LS-d from which the organic substance had been removed was used, and a surface-treatment with an aluminum chelate by a surface-fixation and a thermal decomposition was carried out in the same manner as in Example 1, to obtain a surface-treated through hole-formed substrate (to be referred to as "AN1-A" hereinafter).

Three pieces of copper (oxygen free copper) wires having a diameter of 0.185 mm each were stranded and both ends of the thus-obtained strand were drawn to extend its length by approximately 10%, whereby there was obtained a strand wire having an apparent diameter of approximately 0.35 mm and increased in stiffness.

The strand wire composed of three wires was inserted through each of the 0.35 mm-diameter through holes of AN1-A, both ends of the strand wire were bent and cut. The strand wire-attached AN1-A was dried at 120° C. for 15 minutes.

Thereafter, the strand wire-attached AN1-A was impregnated with the same silicon resin as that in Example 2 and dried repeatedly. The resultant AN1-A was molded and cured and both surfaces thereof were similarly polished to obtain a copper-through resin composite ceramic substrate (to be referred to as "CR1-AN1-ACu" hereinafter).

The obtained CR1-AN1-ACu was measured for a helium transmission rate, conductor resistance and shear resistance. Table 1 shows the results.

Further, a printed wiring pattern was formed on the substrate CR1-AN1-ACu in the same manner as in Example 2.

The obtained copper-through thin film-pattern-attached resin composite ceramic printed wiring board (to be referred to as "PW-CR1-AN1-ACu" hereinafter) was tested for a heat cycle. Table 2 shows the results.

Example 5

A ceramic substrate (AN1-LS) having a thickness of 1.85 mm was obtained in the same manner as in Example 1. Through holes were made in the substrate AN1-LS in predetermined positions with an ultrahard miniature drill having a diameter of 0.40 mm (supplied by Mitsubishi Materials Corporation, order number; 0.40MX) and a guide through hole having a diameter of 3 mm was made, to obtain a through hole-processed substrate.

The hole-processed substrate was placed in a dryer and dried by increasing the temperature stepwise in the manner of 150° C./30 minutes→180° C./30 minutes→200° C./30 minutes. The resultant substrate was taken out and placed on an alumina plate. The substrate on the alumina plate was placed in a nitrogen atmosphere furnace and temperature-increased from 200° C. to 700° C. at a rate of 8° C./minute. The substrate was maintained at 700° C. for 10 minutes and then cooled, whereby the organic substance was removed. The resultant substrate was used, and a surface-treatment with an aluminun chelate by impregnation and a thermal decomposition was carried out in the same manner as in Example 1, to obtain a surface-treated through hole-formed substrate (to be referred to as "AN1-A2" hereinafter).

Seven pieces of copper-plated Kovar wires were placed in an oxygen-free copper tube. The copper tube was drawned to an outside diameter of 0.39 mm and inserted into each of the through holes of AN1-A2. Both ends of the copper tube were bent and cut. Then, the resultant AN1-A2 was dried at 120° C. for 15 minutes.

Thereafter, the wires-possessing-copper tube-attached AN1-A2 was repeatedly impregnated with the same silicon resin as that in Example 2 and dried. The AN1-A2 was molded and cured and both surfaces thereof were similarly polished to obtain a Kovar wires-possessing copper tube-through resin composite ceramic substrate (to be referred to as "CR1-AN1-A2" hereinafter).

The obtained CR1-AN1-A2 was measured for a helium transmission rate, conductor resistance and shear resistance. Table 1 shows the results.

Further, a printed wiring pattern was formed on the substrate CR1-AN1-A2 in the same manner as in Example 2.

The obtained copper-through thin film-pattern-attached resin composite ceramic printed wiring board (to be referred to as "PW-CR1-AN1-A2" hereinafter) was tested for a heat cycle. Table 2 shows the results. Further, in the case of the present method, no level difference was found in the through hole portion so that a flat and smooth finished surface was obtained. Further, in the step of application of a resist ink, no ink blur was found in the through hole portion.

TABLE 1

| Items | | Example 1 | Example 2 | Example 3 | Example 4 | Example 5 |
|---|---|---|---|---|---|---|
| Helium transmission rate | Substrate part | 8.1 | 8.1 | 8.1 | 8.1 | 8.1 |
| | plug | 7.9 | 5.8 | 3.2 | 3.1 | 2.9 |
| Conductor resistance (mΩ/□) | | 1.7 | 2.8 | 1.9 | 1.0 | 1.1 |
| Shear resistance (kg/mm²) | | 4.2 | 5.6 | 3.2 | 3.6 | 3.4 | note 1: Helium transmission rate; $10^{-8}$ Pa/s/m² (at room temperature).

TABLE 2

| Items | Example 1 | Example 2 | Example 3 | Example 4 | Example 5 |
|---|---|---|---|---|---|
| Appearance after cycle test | Good | Good | Good | Good | Good |
| Heat resistance (300° C./30 minutes) | Good | Good | Good | Good | Good |

Note 2: Cycle test; One cycle consisted of −25° C./30 minutes → room temperature/15 minutes → 150° C./30 minutes, 100 cycles.

Effect of the Invention

As apparent from the detailed description of the invention and Examples, the resin composite ceramic printed wiring board having a conductive portion between both surfaces, provided by the present invention, has high airproof properties and shows extremely high endurance and the conductive portion between both surfaces has a low conductor resistance. Further, the resin composite ceramic printed wiring board of the present invention has a low thermal expansion coefficient, high thermal dissipation properties and high heat resistance and it is excellent in flatness, smoothness and thickness accuracy. It may be used as it is. Further, it may be used as a core material for producing a build-up multilayer board composite with polyimide or other highly heat-resistant material and can give a highly reliable multilayer board. The resin composite ceramic printed wiring board of the present invention has great significance.

What is claimed is:

1. A process for the production of a composite ceramic printed wiring board, comprising
   (1) making a penetration hole having a diameter of 0.1 to 0.8 mm in a ceramic board (A) having an open porosity of at least 5% and a thickness of 0.1 to 10 mm,
   (2) fixing metal (M) to the penetration hole such that the metal (M) penetrates through the penetration hole,
   (3) impregnating a heat-resistant resin precursor (R) under vacuum, polymerizing the heat-resistant resin precursor (R) and polishing both surfaces of the resultant board to produce a resin composite ceramic substrate (MIRA) having a conductive portion for conduction between both surfaces in a predetermined portion, and (4) forming printed wiring networks on one or both surfaces of the resin composite ceramic substrate (MIRA).

2. A process for the production of acomposite ceramic printed wiring board according to claim 1, wherein open pores of the ceramic board (A) are impregnated with an organic substance which is solid or is converted to a solid at general temperatures, the formation of a hole in the above (1) is performed in the organic substance-impregnated ceramic board, and after the formation of a hole, the above organic substance is removed before the impregnation of the thermosetting resin (R) in the above (3).

3. A process for the production of a composite ceramic printed wiring board according to claim 1, wherein the metal (M) is selected from gold, silver, copper, tin, nickel, and alloys of these metals, a conductive paste containing a powdery material of the metal (M) and an inorganic binder as essential components is used to fill the hole, the binder is dried and cured at a low temperature of 90 to 250° C. and an organic compound is decomposed and removed at a maximum temperature of 1,100° C. or less as required.

4. A process for the production of a composite ceramic printed wiring board according to claim 1, wherein the metal (M) is a wire or a cross-section multiform wire made of a metal or alloy selected from gold, silver, copper, tin, nickel and alloys of these metals, or a wire of a low thermal expansion coefficient metal, such as Kovar (Fernico) or tungsten, of which the surface is plated with gold, copper nickel or the like, the wire, the cross-section multiform wire or the surface-plated wire is inserted in the hole and it is fixed to the hole.

* * * * *